(12) United States Patent
Smith et al.

(10) Patent No.: US 6,215,430 B1
(45) Date of Patent: Apr. 10, 2001

(54) METHOD AND APPARATUS FOR PROCESSING A DIGITAL SIGNAL FOR ANALOG TRANSMISSION

(75) Inventors: Paul Fielding Smith, North Richland Hills; Kevin Michael Laird, Keller; Danny Thomas Pinckley, Arlington, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/298,541

(22) Filed: Apr. 24, 1999

(51) Int. Cl.[7] .................................................. H03M 1/66
(52) U.S. Cl. ........................................... 341/144; 375/222
(58) Field of Search .................................... 341/144, 143, 341/139, 118, 120; 348/567, 708; 375/240, 222

(56) References Cited

U.S. PATENT DOCUMENTS

| | | | |
|---|---|---|---|
| 5,253,043 | * 10/1993 | Gibson | 348/708 |
| 5,729,230 | * 3/1998 | Jensen et al. | 341/118 X |
| 5,952,947 | * 9/1999 | Nussbaum et al. | 341/143 |
| 6,002,352 | * 12/1999 | El-Ghoroury et al. | 341/139 |

OTHER PUBLICATIONS

Analog Devices, Inc., "14–bit, 150 MSPS TxDAC+ with 2x™ Interpolation Filter", 1999, pp. 1–30.

* cited by examiner

*Primary Examiner*—Patrick Wamsley
(74) *Attorney, Agent, or Firm*—L. Bruce Terry

(57) ABSTRACT

In a digital preprocessing system for processing a digital signal for analog transmission, the digital signal is up-sampled to produce a digital up-sampled signal having signal components in a plurality of Nyquist bands including a first Nyquist band and a plurality of super-Nyquist bands at higher frequencies than the first Nyquist band, wherein the first Nyquist band includes a baseband signal component and a plurality of aliased signal components. Thereafter, one of the plurality of signal components in the first Nyquist band is selected from the digital up-sampled signal. Finally, the selected one of the plurality of signal components is output at a frequency that will cause a digital to analog converter to output an aliased signal component in a super-Nyquist band nearer an anticipated peak amplitude of a filtering characteristic of the digital to analog converter than an aliased signal component in the super-Nyquist band that would be output by the digital to analog converter processing the baseband signal component.

21 Claims, 2 Drawing Sheets

METHOD AND APPARATUS FOR PROCESSING A DIGITAL SIGNAL FOR ANALOG TRANSMISSION

FIELD OF THE INVENTION

The present invention is related in general to digital signal processing, and more particularly to an improved method and system for processing a digital signal for subsequent analog transmission.

BACKGROUND OF THE INVENTION

Digital-to-analog (D/A) conversion is the process of converting digital codes into analog signals. Analog-to-digital (A/D) conversion is the complimentary process of converting a continuous range of analog signals into digital codes. Such conversion processes are necessary to interface real-world systems, which typically monitor continuously varying analog signals, with digital systems that process, store, interpret, and manipulate the analog values.

With the increased sophistication of cellular telephones, hand-held camcorders, portable computers, and set-top cable TV boxes, the requirements or performance criteria of D/A and A/D circuits has increased. These and other similar applications generally have low power and long battery life requirements. They may also have high speed and high resolution requirements.

One example of an application for a high performance digital-to-analog converter (DAC) is converting a digital signal, representing a desired modulated output signal in a digital transmitter, to an analog signal with a relatively high intermediate frequency. The relatively high intermediate frequency is desirable so that filtering subsequent mixer images is easier after the analog signal is mixed to the final radio frequency.

In the past it has been difficult to obtain a useful, high intermediate frequency signal from a low cost DAC because of the sinx/x filtering characteristic typical of a sample-and-hold action of the DAC that reduces the amplitude of signals with higher intermediate signals.

FIG. 1 illustrates a prior art application of a DAC used to convert a modulated digital intermediate frequency signal into an analog signal suitable for transmission, such as radio frequency transmission. As shown in FIG. 1, digital signal source 20 provides a modulated digital intermediate frequency signal that represents data to be transmitted. Such data may represent voice, video, or a data file that may be software, or some sort of user data such as a document. The modulated digital intermediate frequency signal is typically a serial stream of digital bits that comprise symbols that have been processed for transmission over a channel. Such processing may include interleaving and error coding to improve the efficiency of transmission over the channel.

The output of digital signal source 20 is coupled to a digital-to-analog converter (DAC) 22. DAC 22 converts digital codes into a signal having discrete analog voltages.

The output of DAC 22 is coupled to the input of lowpass filter 24, which attenuates all but the first baseband image in the analog signal output by DAC 22. Lowpass filter 24 may be implemented with a surface acoustic wave device or other frequency selective device, which are well known in the art.

Following the output of lowpass filter 24, the analog signal is mixed up to an intermediate frequency (IF) by mixer 26 having an input from a local oscillator with frequency $F_{LO1}$. Note that this mixing function may be thought of as a "frequency translating function" because the frequency of a signal component may be translated, up or down, to a new frequency. In one embodiment, an IF (local oscillator frequency $F_{LO1}$) near 200 MHz is used. Mixer 26 may be implemented with an integrated circuit sold under part number JYM-20H, available from Mini-Circuits, Brooklyn, N.Y.

Mixer 26 is followed by bandpass filter 27 and second mixer 28 that mixes the intermediate frequency output of mixer 26 up to the final transmission frequency, which may be a radio frequency (RF). In one embodiment, an RF (local oscillator frequency $F_{LO2}$) near 2 GHz is used. Mixer 28 may also be implemented with part number JYM-20H, available from Mini-Circuits. Bandpass filter 27 selects, or passes, one of the mixing product signals produced by mixer 26.

Using two mixing stages with a first stage IF at 200 MHz provides a 400 MHz frequency spacing between the mixing product signal pair at the output of mixer 28. This rather large spacing permits the use of an economic, low order filter following mixer 28 (not shown) to select one of the signals in the mixer image pair for final amplification and transmission.

The output of mixer 28 may then be forwarded to an amplifier (not shown) for amplifying a signal to a level that may be transmitted over a channel. The channel may be a radio frequency channel, in which case the signal is transmitted wirelessly from a transmitter to a receiver. Alternatively, the channel may be in another medium, such as a coaxial cable or an optical fiber. In such alternative media, signals output by DAC 22 may still be mixed up to another frequency for the purpose of frequency division multiplexing.

Referring now to FIG. 2, there is depicted a graph of frequency components, and their amplitudes, that are present in the analog signal output by DAC 22.

In graph 40, amplitude is plotted against frequency. On the frequency axis, $F_L$ is the sample frequency of digital signal source 20. A plurality of signal components, including baseband signal component 42 and aliased signal components 44, are shown at various frequencies. Each signal component is in a separate Nyquist band. A first Nyquist band is shown at reference numeral 46 and contains baseband signal component 42. If digital signal source 20 provides a complex digital signal, first Nyquist band 46 is twice as large, extending from zero to the sample frequency $F_L$. Nyquist bands having frequencies higher than the frequency of the first Nyquist band are referred to as "super-Nyquist bands." These super-Nyquist bands are shown at reference numerals 48.

The amplitude of aliased signal components 44 is determined by a filtering characteristic of DAC 22. Filtering characteristic 50, shown in FIG. 2 as a dotted line, has the shape of the mathematical function six/x. Such a filtering function is typical of a DAC having a sample-and-hold output signal. Thus, amplitudes of aliased signal components 44 are determined by the value of the filtering characteristic function at the particular frequency of the aliased signal component.

Although signal components 42 through 44 have been represented in graph 40 as having a single frequency, these signal components may have some finite bandwidth because the signals may have several frequency components spanning such a bandwidth.

In one embodiment of the prior art, $F_L$ may equal 100 MHz. At the output of DAC 22, lowpass filter 24 selects baseband signal 42 and filters out aliased signal components 44. Mixers 26 and 28, together, mix baseband signal 42 up to a 2 GHz frequency, which may be 20 times the frequency of $F_L$. Two mixers are typically required because at the transmission frequency a mixer image needs to be filtered from the transmitted signal and it is difficult to filter such a mixer image when its frequency is close to the frequency of the transmitted signal. By using two mixers and mixing in two stages, the transmitted signal and its mixer image are separated in frequency, which makes the mixer image filter easier to implement because it can be designed with fewer poles.

Because filters with a higher number of poles are more difficult to design and implement, an upsampler may be used prior to the DAC in order to separate the baseband signal from the aliased signal components. This allows the use of a filter with fewer poles to filter the aliased signal components from the baseband signal.

As shown in FIG. 3, upsampler 60 and lowpass digital filter 62 are used to process the signal output by digital signal source 20 prior to being input to DAC 66. Upsampler 60 performs a "zero stuffing" function wherein one digital symbol is input into upsampler 60 and, for example, three digital symbols are output from upsampler 60. Of these output symbols, one symbol is the originally input symbol and the following symbols are zero valued symbols. In the examples shown in FIGS. 3 and 4, upsampler 60 upsamples by a factor of M, where M equals three.

Lowpass digital filter 62 filters out aliased signal components output by upsampler 60 in the new, larger, first Nyquist band 64. Note that the Nyquist bands in FIG. 4 are larger, or broader, because of the upsampling function.

The output of lowpass digital filter 62 is input into DAC 66, which operates, in this example, at sampling frequency $F_H$, which is three times faster than DAC 22 shown in FIG. 1. The graph shown in FIG. 4 shows the frequency components of the output of DAC 66. Baseband signal component 42 is located in first Nyquist band 64. Aliased signal components 44 are located in super-Nyquist bands 68. Note that the Nyquist bands in FIG. 4 are three times as wide as the Nyquist bands shown in FIG. 2. The wide Nyquist bands are a result of upsampler 60 and DAC 66 operating three times as fast.

The output of DAC 66 is filtered by lowpass filter 70 in order to remove aliased signal components 44 in super-Nyquist bands 68. Following lowpass filter 70, mixers 26 and 28 frequency translate baseband signal component 42 up to the desired transmission frequency. Note that lowpass filter 70 may be implemented with a filter having fewer poles than lowpass filter 24 (see FIG. 1). This makes lowpass filter 70 less expensive and easier to build. Fewer poles are needed because baseband signal 42 is spaced further apart in frequency from aliased signal components 44 as shown by the difference between FIGS. 2 and 4.

While the digital signal processing shown in FIG. 3 allows for a simpler lowpass filter at the output of the DAC, the circuit in FIG. 3 still requires two mixers in order to translate the DAC output to the desired transmission frequency. Therefore, a need exists in the prior art for an improved method and system for processing a digital signal for analog frequency transmission that eliminates the need for two mixers for mixing an output of a DAC up to a desired transmission frequency and permits the use of a simpler, lower order filter, to filter a mixer image to produce a signal for transmission.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF THE INVENTION

Figure 5:
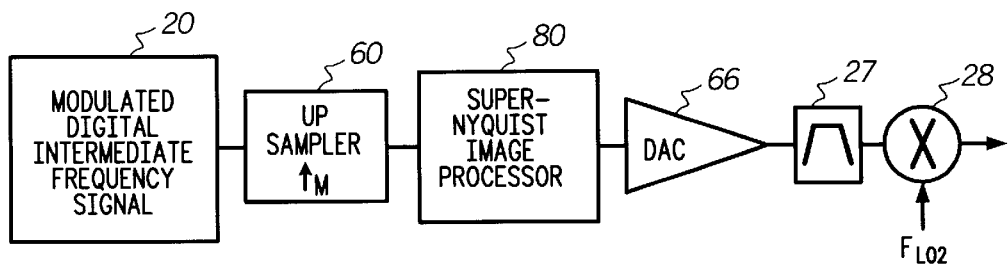
FIG. 5 illustrates a system for processing a digital system for analog transmission in accordance with the method and system of the present invention.

With reference now to FIG. 5, there is depicted a system for processing a digital signal for analog transmission in accordance with the method and system of the present invention. As shown, data source 20 outputs a modulated digital intermediate frequency signal that comprises a sequence of symbols that represent voltage samples of a modulated waveform. The symbol rate of data source 20 is $F_L$. The symbols output by digital signal source 20 are coupled to upsampler 60 which upsamples the signal by a factor M. This upsampling function typically receives a single symbol and outputs that symbol followed by M-1 zero-valued symbols, as discussed above with reference to the prior art. The upsampled symbol rate is $F_H$.

The output of upsampler 60 is coupled to the input of super-Nyquist image processor 80, which outputs a modified digital signal. This modified digital signal is discussed in further detail below.

The output of super-Nyquist image processor 80 is coupled to the input of DAC 66, which converts the digital signal input to an analog signal output at the same rate as the output of upsampler 60. DAC 66 may be implemented with an integrated circuit sold under part number DAC600 by Burr-Brown, of Tucson, Ariz.

Figure 6:
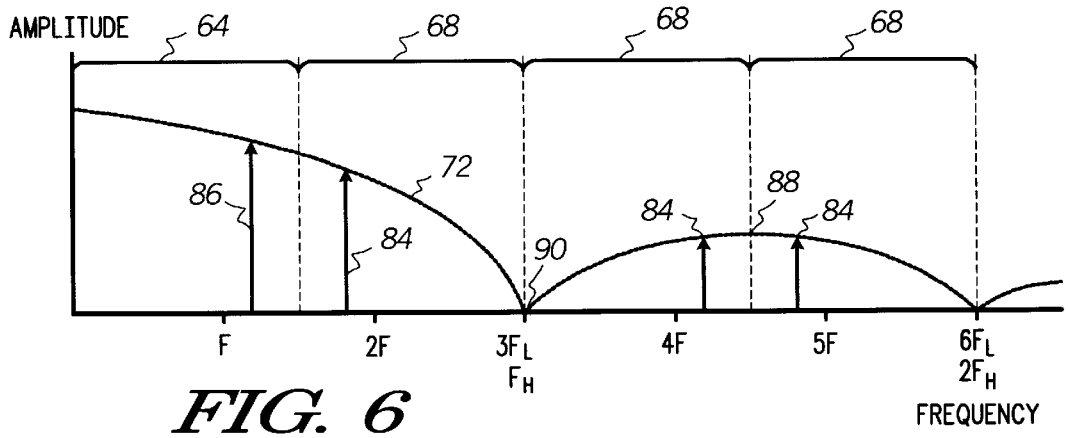
FIG. 6 is a graph of frequency versus amplitude for signal components in an analog signal output by the DAC in FIG. 5 in accordance with the method and system of the present invention.

The output of DAC 66 is coupled to bandpass filter 27. The purpose of bandpass filter 27 is to select one of the aliased signal components 84 (see FIG. 6), which are images of baseband signal component 86. The bandwidth of bandpass filter 27 should be small enough to select a single aliased signal component 84 in one of the super-Nyquist bands 68.

The output of bandpass filter 27 is coupled to mixer 28, which mixes the selected aliased signal component up to the transmission frequency. This mixing may also be referred to as frequency translating. Mixer 28 has an input from a local oscillator operating at a frequency $F_{LO2}$.

Referring again to FIG. 6, there is depicted a graph that shows the frequency of signal components of the analog signal output by DAC 66. These signal components include baseband signal component 86, shown in first Nyquist band 64, and aliased signal components 84, shown in various super-Nyquist bands 68 that each have a higher frequency than first Nyquist band 64. Both baseband signal component 86 and aliased signal components 84 have amplitudes determined by filtering characteristic 72 of DAC 66. Note that filtering characteristic 72 has peak amplitudes and null amplitudes as shown at the frequencies indicated by reference numerals 88 and 90, respectively. As used herein, the term "null" refers to a local minimum in a plot or curve that represents the filtering characteristic 72 of the digital-to-analog converter.

While the present invention has been shown with examples using real digital signals, the present invention may also be used to process complex digital signals. When complex digital signals are used, the first Nyquist band is twice as large, extending from zero to the sample frequency.

Referring again to the function performed by super-Nyquist image processor 80 in FIG. 5, the function may be described as one that outputs a selected signal component at a frequency that will cause a subsequent digital-to-analog converter, such as DAC 66, to output an aliased signal component in a super-Nyquist band nearer an anticipated peak amplitude of filtering characteristic 72 of DAC 66 than an aliased signal component in the same super-Nyquist band that would have been created by baseband signal component 42.

Figure 3:
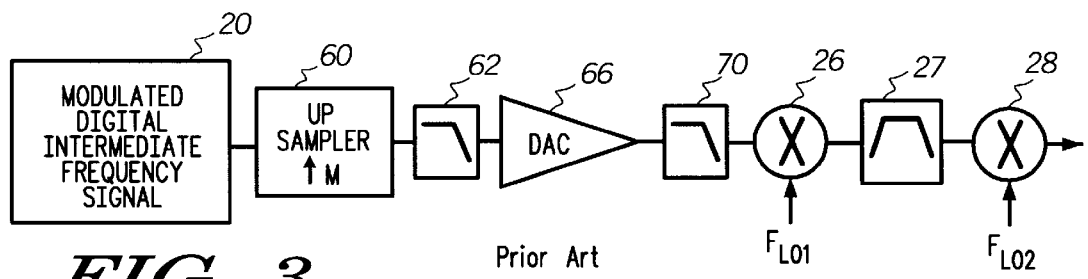
FIG. 3 is a prior art circuit including an upsampler and lowpass digital filter for processing a digital signal for analog transmission.
Figure 4:
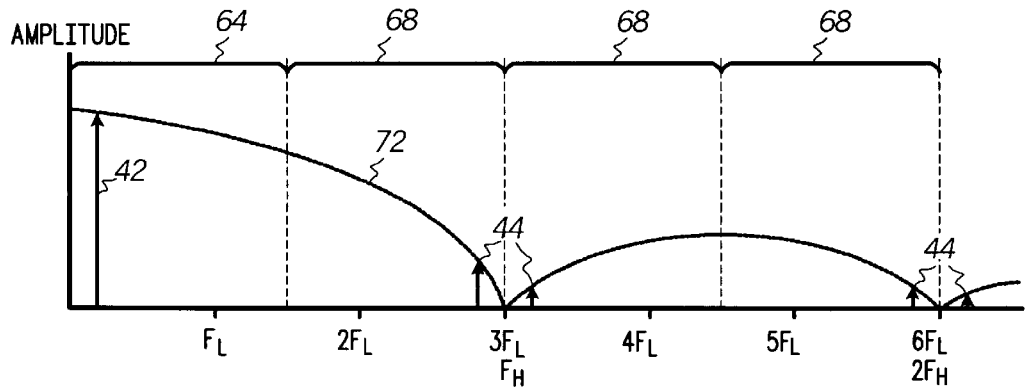
FIG. 4 is a graph of the frequency components of the signal output by the DAC in FIG. 3.

As shown and discussed with reference to FIG. 4, DAC 66 outputs aliased image components 44 from baseband image component 42, and aliased signal components 44 are located near nulls, or further from peaks, in filtering characteristics 72. As shown in FIG. 4, filtering characteristic 72 is a typical sinx/x filtering function that occurs within a DAC as a result of a sampled-and-held output signal. According to an important aspect of the present invention, the signal components output by super-Nyquist image processor 80 are located closer to peaks 88 (see FIG. 6) in super-Nyquist bands 68 of filtering characteristic 72. In contrast, the frequency components input into DAC 66 in FIG. 3 are shown in FIG. 4 as being closer to the nulls (i.e., frequencies $F_H$ and $2F_H$ . . . ) in filtering characteristic 72.

Figure 1:
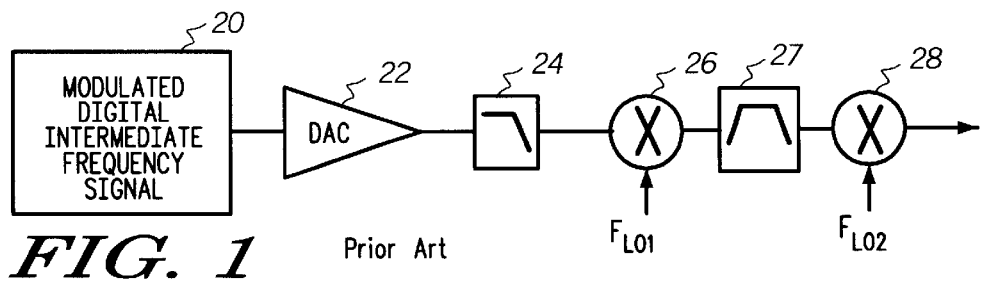
FIG. 1 illustrates a prior art circuit for converting a modulated digital intermediate frequency signal into an analog signal suitable for transmission.
Figure 2:
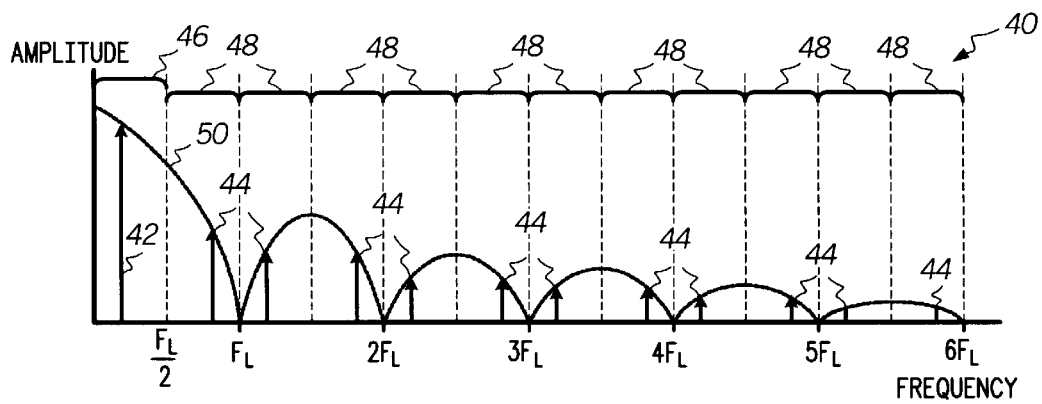
FIG. 2 depicts a graph of frequency versus amplitude for signal components in the analog signal output by the DAC of FIG. 1.
Figure 7:
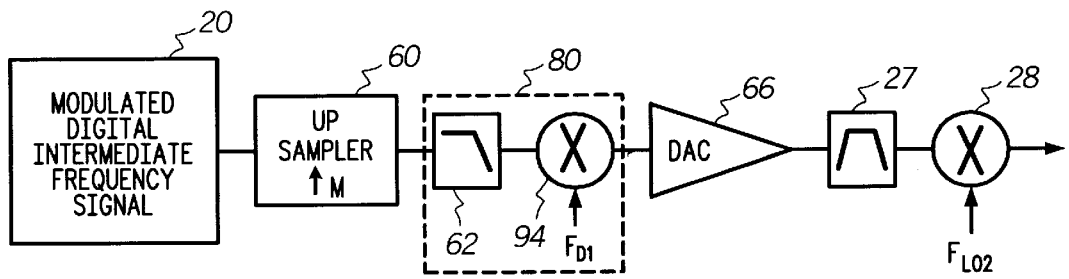
FIG. 7 is an alternate embodiment of the circuit shown in FIG. 5 in accordance with the method and system of the present invention.

With reference now to FIG. 7, there is depicted a second embodiment of the system for processing a digital signal for analog transmission in accordance with the method and system of the present invention. As shown, FIG. 7 includes digital signal source 20 coupled to upsampler 60. The output of upsampler 60 is coupled to super-Nyquist image processor 80, which includes digital lowpass filter 62 coupled to digital mixer 94, which has an input from a local oscillator with frequency $F_{D1}$. In this embodiment, lowpass digital filter 62 selects the baseband signal component, such as baseband signal component 42 shown in FIG. 2, so that it can be frequency translated to a higher frequency to cause the output of DAC 66 to produce an aliased signal component in a super-Nyquist band nearer an anticipated peak amplitude of the filtering characteristic of the DAC. In this manner, super-Nyquist image processor 80 outputs a selected one of a plurality of signal components at a frequency that will cause a digital-to-analog converter to output an aliased signal component in a super-Nyquist band nearer an anticipated peak amplitude of a filtering characteristic of a digital-to-analog converter than an aliased signal component in a super-Nyquist band that would be created by the baseband signal component. In other words, frequency translating the baseband signal component to a higher frequency places the newly created aliased signal components nearer the peak of the filtering function of the DAC.

Frequency $F_{D1}$ of the frequency translation signal applied to digital mixer 94 is preferably equal to one half of the upsampled symbol rate $F_H$. By selecting this frequency, the digital translation signal applied to digital mixer 94 comprises the sequence {1−1,1,−1,1,−1, . . . }. This sequence significantly reduces the circuitry required to implement digital mixer 94.

In an alternate embodiment, $F_{D1}$ is equal to one fourth of the upsampled symbol rate $F_H$. With this selection, the digital translation signal applied to digital mixer 94 comprises the sequence {1,0,−1,0,1,0,−1,0,1, . . . }.

Figure 8:
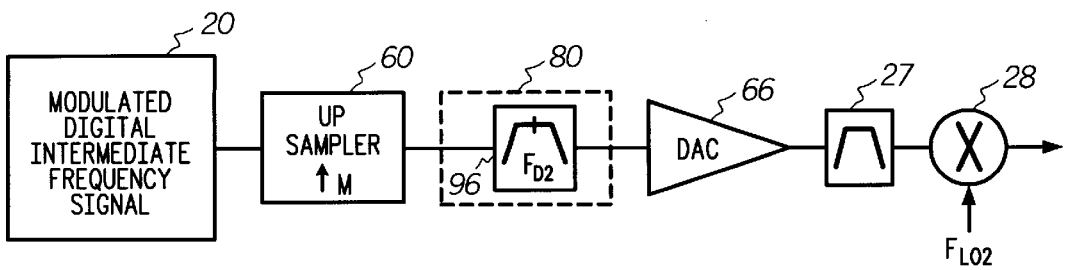
FIG. 8 is yet another embodiment of the circuit shown in FIG. 5 in accordance with the method and system of the present invention.

With reference now to FIG. 8, there is depicted a third embodiment of the system for processing a digital signal for analog transmission in accordance with the method and system of the present invention. As shown, this system is similar to that shown in FIG. 7, with the exception of the embodiment of super-Nyquist image processor 80. In this embodiment, super-Nyquist image processor 80 selects and outputs a signal component by using digital bandpass filter 96, with a center frequency $F_D$, to select an aliased signal component in the first Nyquist band, and outputs the selected component to DAC 66. Note that selecting any aliased signal component in the first Nyquist band 64 will result in the DAC outputting aliased signal components nearer a peak of filtering characteristic 72 than an aliased signal component that would be output if baseband signal component 42 had been input directly into DAC 66.

The benefit of super-Nyquist image processor 80 is that the DAC produces an output that includes aliased signal components having amplitudes with signal-to-noise ratios that may be mixed up to the transmission frequency. That is, the aliased signal components are useful signals because they have higher signal-to-noise ratios than those in the prior art shown in FIG. 4, which makes them suitable for transmission.

In addition to the higher signal-to-noise ratio of the aliased signal component, the aliased signal components occur at frequencies higher than that of baseband signal component 42, which makes it easier to select or filter a transmission signal from the mixed image pair output by RF mixer 28. Having a greater distance between mixer product pairs means that a lower order filter may be used to select one of the components for transmission.

Thus, the embodiment shown in FIG. 7 involves selecting a signal component and moving it. When a digital lowpass filter is used to select the signal component, the baseband signal component is selected and moved. Alternatively, an aliased signal component in the first Nyquist band may be selected, by using a bandpass filter as shown in FIG. 8, and then moved by frequency translation.

In summary, the present invention has the benefit of digitally processing a signal so that a DAC outputs a signal with a sufficient signal-to-noise ratio at a frequency that may be mixed with a single stage mixer and filtered to produce an analog transmission signal.

The foregoing description of a preferred embodiment of the invention has been presented for the purpose of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for processing a digital signal for analog transmission, the method comprising the steps of:

up-sampling a digital signal to produce a digital up-sampled signal having signal components in a plurality of Nyquist bands including a first Nyquist band and a plurality of super-Nyquist bands at higher frequencies than the first Nyquist band, wherein the first Nyquist band includes a plurality of signal components, including a baseband signal component and a plurality of aliased signal components;

selecting, from the digital up-sampled signal, one of the plurality of signal components in the first Nyquist band; and outputting the selected one of the plurality of signal components at a frequency that will cause a digital to analog converter to output an aliased signal component in a super-Nyquist band nearer an anticipated peak amplitude of a filtering characteristic of the digital to analog converter than an aliased signal component in the super-Nyquist band that would be created by the baseband signal component.

2. The method for processing a digital signal according to claim 1 further including steps of:

frequency translating the selected one of the plurality of signal components to a frequency that will cause a digital to analog converter to output an aliased signal component in a super-Nyquist band nearer an anticipated peak amplitude of a filtering characteristic of the digital to analog converter than an aliased signal component in the super-Nyquist band that would be created by the baseband signal component, wherein a frequency translated signal component is produced; and outputting the frequency translated signal component.

3. The method for processing a digital signal according to claim 2 wherein the step of selecting one of the plurality of signal components in the first Nyquist band further includes selecting the baseband signal component.

4. The method for processing a digital signal according to claim 3 wherein the step of selecting one of the plurality of signal components in the first Nyquist band further includes lowpass filtering the baseband signal component.

5. The method for processing a digital signal according to claim 2 wherein the step of frequency translating the selected one of the plurality of signal components to a frequency that will cause a digital to analog converter to output an aliased signal component in a super-Nyquist band nearer an anticipated peak amplitude of a filtering characteristic of the digital to analog converter than an aliased signal component in the super-Nyquist band that would be created by the baseband signal component, wherein a frequency translated signal component is produced further includes mixing the selected one of the plurality of signal components to a frequency that will cause a digital to analog converter to output an aliased signal component in a super-Nyquist band nearer an anticipated peak amplitude of a filtering characteristic of the digital to analog converter than an aliased signal component in the super-Nyquist band that would be created by the baseband signal component to produce a frequency translated signal component.

6. The method for processing a digital signal according to claim 5 wherein the step of mixing the selected one of the plurality of signal components further includes mixing the selected one of the plurality of signal components with a signal having a frequency equal to one half the sample rate of the selected one of the plurality of signal components to produce a frequency translated signal component.

7. The method for processing a digital signal according to claim 5 wherein the step of mixing the selected one of the plurality of signal components further includes mixing the selected one of the plurality of signal components with a signal having a frequency equal to one fourth the sample rate of the selected one of the plurality of signal components to produce a frequency translated signal component.

8. The method for processing a digital signal according to claim 1 wherein the step of selecting one of the plurality of signal components in the first Nyquist band further includes selecting one of the aliased signal components.

9. The method for processing a digital signal according to claim 8 wherein the step of selecting one of the aliased signal components in the first Nyquist band further includes bandpass filtering one of the plurality of aliased signal components.

10. A system for processing a digital signal for analog transmission comprising:

means for up-sampling a digital signal to produce a digital up-sampled signal having signal components in a plurality of Nyquist bands including a first Nyquist band and a plurality of super-Nyquist bands at higher frequencies than the first Nyquist band, wherein the first Nyquist band includes a plurality of signal components, including a baseband signal component and a plurality of aliased signal components;

means for selecting, from the digital up-sampled signal, one of the plurality of signal components in the first Nyquist band; and means for outputting the selected one of the plurality of signal components at a frequency that will cause a digital to analog converter to output an aliased signal component in a super-Nyquist band nearer an anticipated peak amplitude of a filtering characteristic of the digital to analog converter than an aliased signal component in the super-Nyquist band that would be created by the baseband signal component.

11. The system for processing a digital signal according to claim 10 further including:

means for frequency translating the selected one of the plurality of signal components to a frequency that will cause a digital to analog converter to output an aliased signal component in a super-Nyquist band nearer an anticipated peak amplitude of a filtering characteristic of the digital to analog converter than an aliased signal component in the super-Nyquist band that would be created by the baseband signal component, wherein a frequency translated signal component is produced; and means for outputting the frequency translated signal component.

12. The system for processing a digital signal according to claim 11 wherein the means for selecting one of the plurality of signal components in the first Nyquist band further includes means for selecting the baseband signal component.

13. The system for processing a digital signal according to claim 12 wherein the means for selecting one of the plurality of signal components in the first Nyquist band further includes means for lowpass filtering the baseband signal component.

14. The system for processing a digital signal according to claim 11 wherein the means for frequency translating the selected one of the plurality of signal components to a frequency that will cause a digital to analog converter to output an aliased signal component in a super-Nyquist band nearer an anticipated peak amplitude of a filtering characteristic of the digital to analog converter than an aliased signal component in the super-Nyquist band that would be created by the baseband signal component, wherein a frequency translated signal component is produced further includes means for mixing the selected one of the plurality of signal components to a frequency that will cause a digital to analog converter to output an aliased signal component in a super-Nyquist band nearer an anticipated peak amplitude of a filtering characteristic of the digital to analog converter than an aliased signal component in the super-Nyquist band that would be created by the baseband signal component to produce a frequency translated signal component.

15. The system for processing a digital signal according to claim 14 wherein the means for mixing the selected one of the plurality of signal components further includes means for mixing the selected one of the plurality of signal components with a signal having a frequency equal to one half the sample rate of the selected one of the plurality of signal components to produce a frequency translated signal component.

16. The system for processing a digital signal according to claim 14 wherein the means for mixing the selected one of the plurality of signal components further includes means for mixing the selected one of the plurality of signal components with a signal having a frequency equal to one fourth the sample rate of the selected one of the plurality of signal components to produce a frequency translated signal component.

17. The system for processing a digital signal according to claim 10 wherein the means for selecting one of the plurality of signal components in the first Nyquist band further includes means for selecting one of the aliased signal components.

18. The system for processing a digital signal according to claim 17 wherein the means for selecting one of the aliased signal components in the first Nyquist band further includes means for bandpass filtering one of the plurality of aliased signal components.

19. A signal processing system for processing a digital signal prior to converting the digital signal to an analog signal for transmission, comprising:

an up-sampler for up-sampling the digital signal to produce a digital up-sampled signal having a plurality of signal components including a baseband signal component and a plurality of aliased signal components;

a signal component and frequency selector coupled to the digital up-sampled frequency for selecting a selected signal component of the plurality of signal components and outputting the selected signal component at a frequency that will cause a digital to analog converter that processes the selected signal component to output an aliased signal component in a super-Nyquist band nearer an anticipated peak amplitude of a filtering characteristic of the digital to analog converter Man an aliased signal component in the super-Nyquist band that would be output by the digital to analog converter processing the baseband signal component.

20. The signal processing system according to claim 19 wherein the signal component and frequency selector further comprises:

a lowpass filter for selecting a baseband signal component; and a digital mixer for frequency translating the baseband signal component to a frequency that will cause a digital to analog converter that processes the selected signal component to output an aliased signal component in a super-Nyquist band nearer an anticipated peak amplitude of a filtering characteristic of the digital to analog converter than an aliased signal component in the super-Nyquist band that would be output by the digital to analog converter processing the baseband signal component.

21. The signal processing system according to claim 19 wherein the signal component and frequency selector further comprises a bandpass filter for selecting a signal component having a frequency that will cause a digital to analog converter that processes the selected signal component to output an aliased signal component in a super-Nyquist band nearer an anticipated peak amplitude of a filtering characteristic of the digital to analog converter than an aliased signal component in the super-Nyquist band that would be output by the digital to analog converter processing the baseband signal component.

\* \* \* \* \*